United States Patent [19]

Wetteroth

[11] Patent Number: 4,775,643

[45] Date of Patent: Oct. 4, 1988

[54] MESA ZENER DIODE AND METHOD OF MANUFACTURE THEREOF

[75] Inventor: Thomas A. Wetteroth, Scottsdale, Ariz.

[73] Assignee: Motorola Inc., Schaumburg, Ill.

[21] Appl. No.: 56,166

[22] Filed: Jun. 1, 1987

[51] Int. Cl.⁴ .................. H01L 21/70; H01L 27/00; H01L 21/44; H01L 21/48
[52] U.S. Cl. ............................. 437/061; 437/904; 437/189; 148/DIG. 174; 357/13
[58] Field of Search ........... 437/189, 061, 063, 904, 437/905, 906; 357/13, 56, 48, 49, 50; 148/DIG. 174

[56] References Cited

U.S. PATENT DOCUMENTS

| | | | |
|---|---|---|---|
| 4,028,563 | 6/1977 | Geisler | 357/13 |
| 4,030,117 | 6/1977 | Kling | 357/13 |
| 4,177,095 | 12/1979 | Nelson | 357/13 |
| 4,484,206 | 11/1984 | Moroshima et al. | 357/13 |
| 4,594,602 | 6/1986 | Iimura et al. | 357/13 |
| 4,646,114 | 2/1987 | Vinn et al. | 357/13 |

OTHER PUBLICATIONS

Wilson et al., "Rapid Annealing Technology For Future VLSI", Solid State Technology, June 1985, pp. 185-190.
Ghandhi, VLSI Fabrication Principles, John Wiley and Sons, 1983, pp. 371-417, 542-548, 569-575.

*Primary Examiner*—Brian E. Hearn
*Assistant Examiner*—M. Wilczewski
*Attorney, Agent, or Firm*—Raymond J. Warren; Joe E. Barbee

[57] ABSTRACT

A mesa Zener diode is described which is manufactured by ion implanting a region of opposite conductivity into a substrate; etching a moat in a surface of the substrate through the region of opposite conductivity; depositing an oxide layer having an opening exposing a portion of the mesa; and depositing top and bottom metals.

13 Claims, 6 Drawing Sheets

MESA ZENER DIODE AND METHOD OF MANUFACTURE THEREOF

BACKGROUND OF THE INVENTION

The present invention relates, in general, to zener diodes and, more particularly to mesa zener diodes and the manufacture thereof.

Various types of Zener diodes are known in the art. These devices are designed to go into non-destructive Zener, avalanche, breakdown at particular voltages. As used herein, the term "Zener" or "Zener diode" is intended to encompass all such voltage reference behavior devices, irrespective of the particular breakdown mechanism which gives rise to the voltage reference behavior.

In general, Zener diodes consist of a p-n junction formed from two oppositely doped semiconductor regions having carefully controlled dopant concentration and distribution. For Zener diodes with minimum breakdown voltage, i.e. about 1.8 volts, the p and n regions must both be very highly doped, typically in the range of $10^{19}$ to $10^{21}$ per $cm^3$, and the junction must be abrupt. This requires a very steep doping profile. In the prior art, alloying has been a preferred method of fabricating Zener diodes in the voltage range of 1.8 to about 10 volts.

The Zener voltage may be increased by reducing the doping, first on one side of the p-n junction, for voltages in the range 1.8 to about 10 volts, and then on both sides of the p-n junction for voltages approximately in the range 10 to 200 volts. Diffusion has been a preferred method for fabricating Zener diodes which operate in the range of about 10 to 200 volts. Diodes having voltages around 10 volts may be fabricated by either method.

The various methods of manufacturing Zener diodes generally utilize a diffusion step to form a portion of the Zener, along with a getter to remove various defects and impurities from the p-n junction. These processing functions have associated processing steps that attribute to the final cost of the devices.

Accordingly, it is an object of the present invention to provide means and methods for manufacture of Zener diodes that overcome the above deficiencies.

It is another object of the present invention to provide means and methods for the manufacture of Zener diodes that do not require diffusion.

It is a further object of the present invention to provide means and methods for manufacture of Zener diodes that do not require a getter process.

It is still a further object of the present invention to provide means and methods for manufacture of Zener diodes that have fewer processing steps and are more economical to produce.

SUMMARY OF THE INVENTION

The above and other objects and advantages of the present invention are provided by the means and methods of producing Zener diodes described herein.

A particular embodiment of the present invention consists of a method of manufacturing Zener diodes comprising the steps of: implanting a dopant of a first conductivity type into a surface region of a substrate of a second conductivity type; forming a mesa defined by a moat extending through the surface region; oxidizing a first face of the substrate; delineating an opening within the oxide layer exposing a portion of the mesa; and forming a metal contact to the exposed portion of the mesa.

DETAILED DESCRIPTON OF THE DRAWINGS

Figure 1:
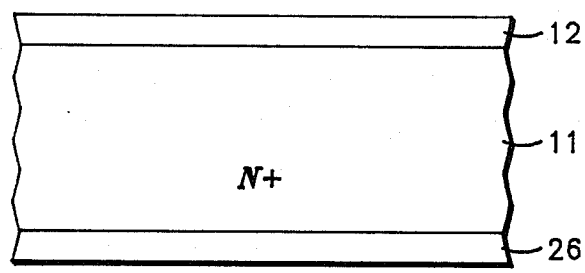
FIGS. 1-8 are process flow diagrams of the manufacture of a prior art Zener diode.
Figure 2A:
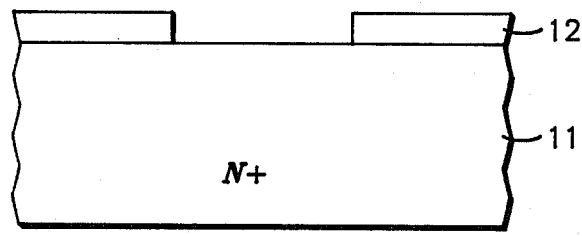
Figure 2B:
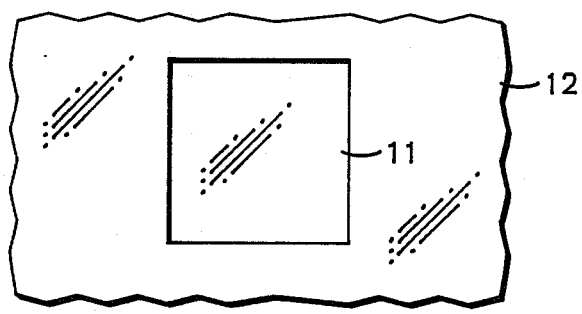
Figure 3:
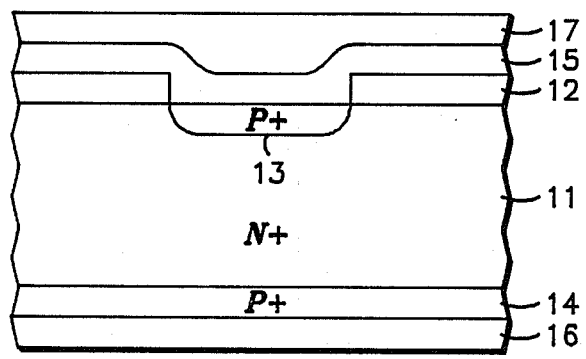
Figure 4:
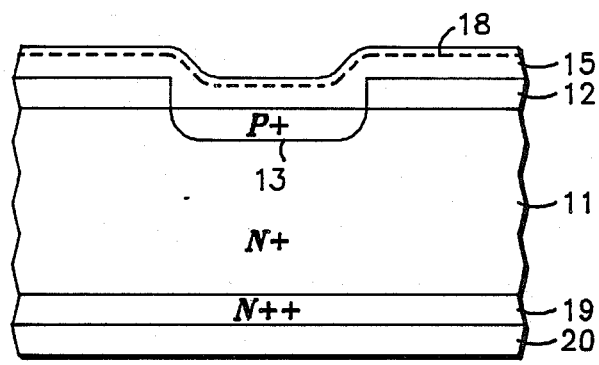
Figure 5:
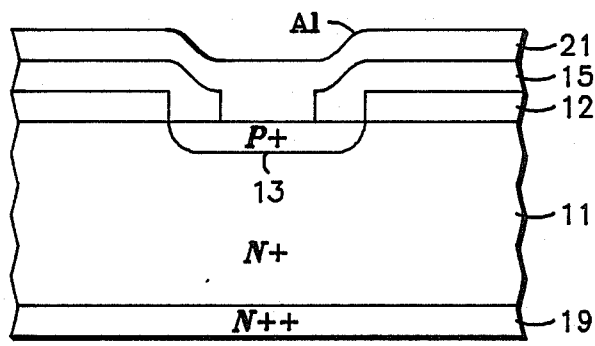

Referring now to the diagrams of FIGS. 1-8, a process of the manufacture of a prior art Zener diode, generally designated 10, is illustrated. FIG. 1 shows an N+ doped substrate 11 after having been oxidized forming oxide layers 12 and 26. A photo/etch is then performed on Zener 10 leaving an opening in oxide 12 and removing oxide layer 26, FIG. 2A. FIG. 2B represents a top view of FIG. 2A.

Next a boron diffusion is performed on Zener 10. This consists of three steps. First, a layer of boron is deposited on the surfaces of Zener 10. Second, the boron dopant is driven into the exposed portions of substrate 11 forming diffused regions 13 and 14. Finally, the surfaces are oxidized forming oxide layers 15 and 16. A layer of photoresist 17 is then deposited on the upper surface of Zener 10.

A getter process is then performed upon Zener 10. This consists of etching Zener 10 to remove oxide layer 16. Photoresist layer 17 is then removed, FIG. 4. Zener 10 is then placed in a phosphine tube and baked causing phosphorus to be diffused into the surface of oxide 15, represented by dashed line 18 and into the bottom surface of substrate 11 forming an N++ layer 19. The baking also causes a glass ($P_2O_5$) 20 to be formed on the bottom of substrate 11, below region 19. This getter process causes damage and impurities to be pulled away from the p-n junction. The bottom portion of substrate 11 will be lapped at a later time to remove area 19.

Following the getter, Zener 10 is subjected to an HF, hydrofluoric acid, dip to remove glass 20 and the portion of oxide 15 which was contaminated by the phosphorus. Oxide 15 is then masked and etched to form an opening over diffused area 13. A layer of aluminum is then deposited on the upper surface of Zener 10, FIG. 5.

Figure 6:
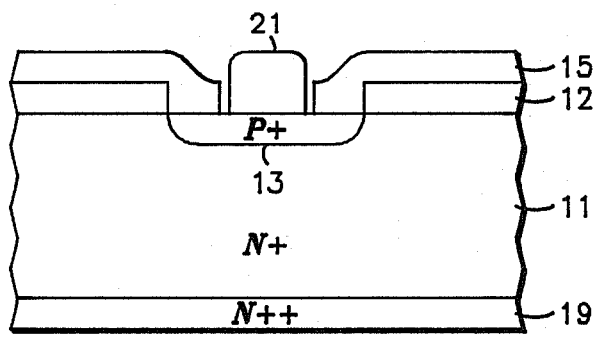
Figure 7:
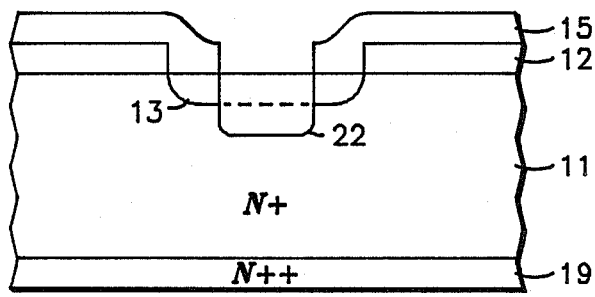

Next, layer 21 is masked and etched leaving an aluminum post 21, FIG. 6. Aluminum post 21 is then driven thru region 13 into substrate 11 forming a P+ Alloy region 22, FIG. 7. Any excess of aluminum post 21 is then removed.

Figure 8:
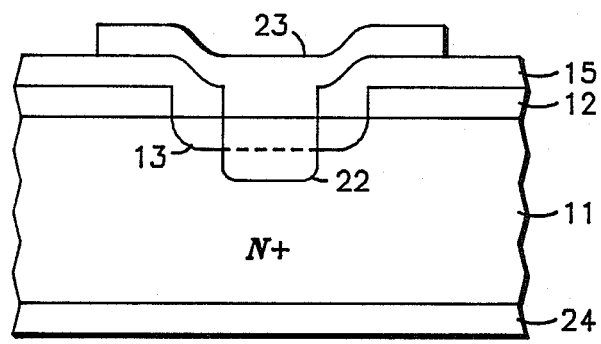

Zener 10 then goes through some standard finishing steps such as lapping to remove region 19 of substrate 11 and depositing a top metal 23 and a bottom metal 24, FIG. 8. Top and bottom metals, 23 and 24, are generally a layered titanium-nickel-silver composite (TiNiAg). In the final device, P+ region 13 is on the order of 3-4 microns and P+ alloy region 22 has a depth of 5-7 microns with the whole substrate 11 having a thickness of about 8 millimeters.

The drawbacks to this prior art type of Zener processing are that: the diffusion of the p-n junction, which requires several steps; the diffusion of aluminum to form a p alloy region; and the getter to remove impurities and defects.

Figure 9:
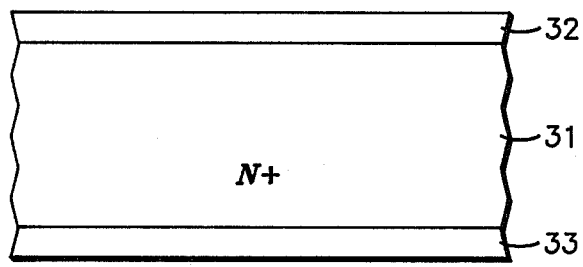
FIGS. 9-12 are process flow diagrams of the manufacture of a second prior art Zener diode.
Figure 10A:
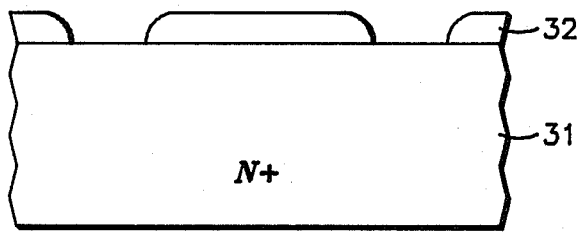
Figure 10B:
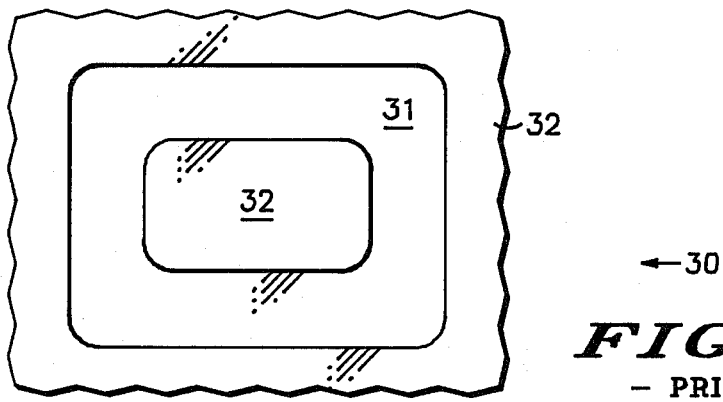
Figure 11:
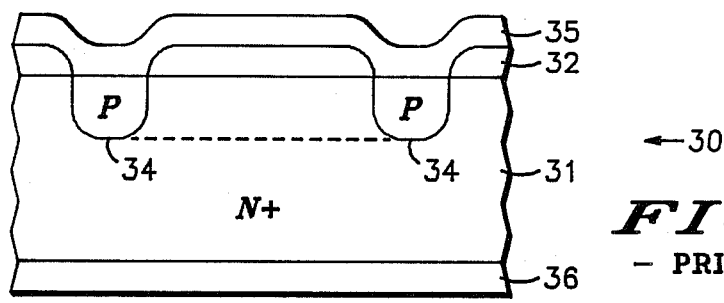

Referring now to the diagrams of FIGS. 9–16, a second process for the manufacture of a second prior art Zener diode, generally designated 30, is illustrated. As shown in FIG. 9, the processing of Zener 30 commences with an n-type substrate 31 being oxidized to form oxide layers 32 and 33. Next, as shown in FIGS. 10A and 10B, Zener 30 is masked and etched; removing oxide 33 and forming a ring opening in oxide 32. This ring shaped opening defines the deposition area for a guard ring.

A guard ring is then formed in substrate 31 by: depositing a p-type substance (Boron) on the surface of Zener 30; driving the p-type substance into substrate 31 at the open ring area of oxide 32; and oxidizing Zener 30. This forms the device illustrated in FIG. 11 having a diffused guard ring 34 and oxide layers 35 and 36.

Figure 12:
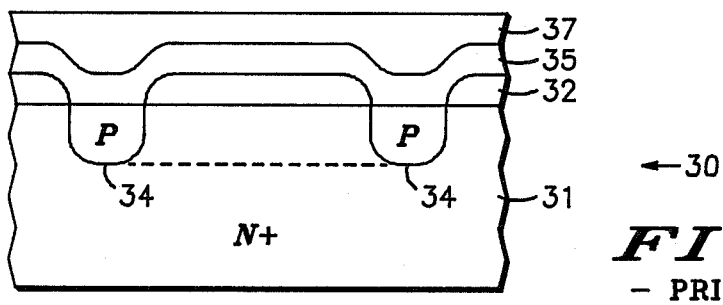
Figure 13:
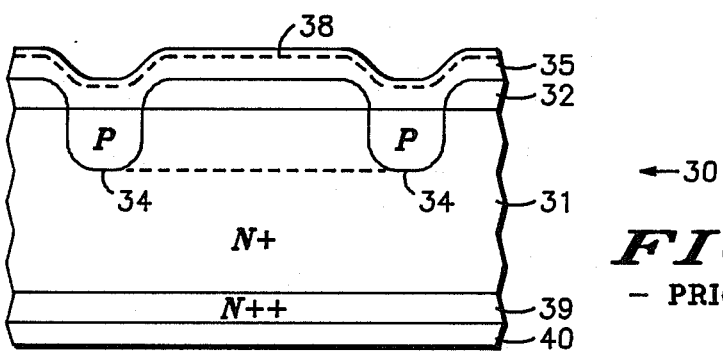
FIGS. 13-17 are process flow diagrams of the manufacture of a Zener diode in accordance with the present invention.

A getter process is then performed by first depositing a layer of photoresist 37 on the top of device 30 and etching to remove oxide layer 36, FIG. 12. In FIG. 13, Zener 30 is illustrated following the getter process. Photoresist layer 37 is first removed. Zener 30 is then placed in a phosphine tube and baked causing phosphorus to be diffused into the surface of oxide 35, represented by dashed line 38, and into the bottom surface of substrate 31, forming an N++ layer 39. The baking also causes a glass ($P_2O_5$) layer 40 to be formed on the bottom of substrate 31, below region 39. This getter process causes damage and impurities to be pulled away from the p-n. At a later time the bottom portion of substrate 11 is removed by lapping; which will remove area 39.

Figure 14:
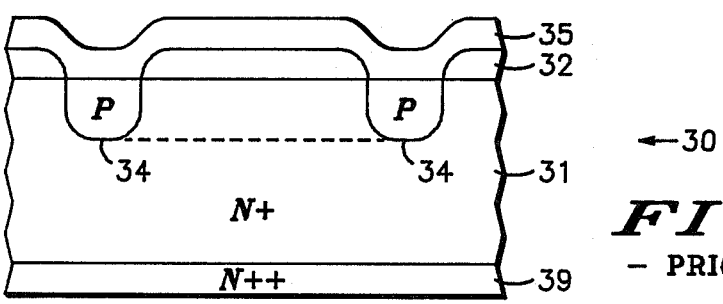
Figure 15:
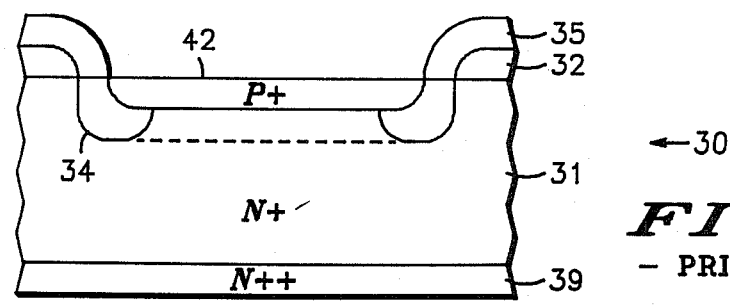

Following the getter, Zener 30 is subjected to an HF dip to remove glass 40 and the portion of oxide 35 which was contaminated by the phosphorus, FIG. 14. Oxide 35 is then masked and etched to form an opening as shown in FIG. 15. A p-type dopant is then implanted into the exposed surface of substrate 31 forming a P+ region 42. This may then be annealed, by Rapid Thermal Anneal (RTA), conventional furnace annealing, or the like, to set the appropriate breakdown voltage by causing a planar depletion spread in region 42.

Figure 16:
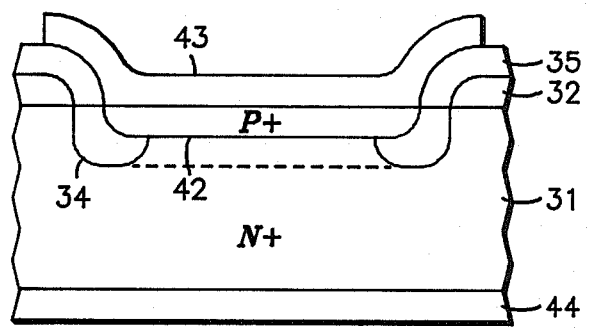

Zener 30 then goes through some standard finishing steps, such as lapping to remove region 39 of substrate 31; and depositing a top metal 43 and a bottom metal 44, FIG. 16. Top and bottom metal layers, 43 and 44, are generally a layered TiNiAg composite or the like.

The drawbacks of this method of processing are that: there is still diffusion required to form guard ring 34, whic requires several steps; and a getter step is still required to remove impurities and defects.

Figure 17:
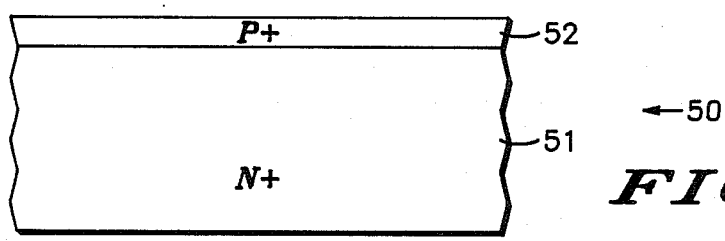
Figure 18A:
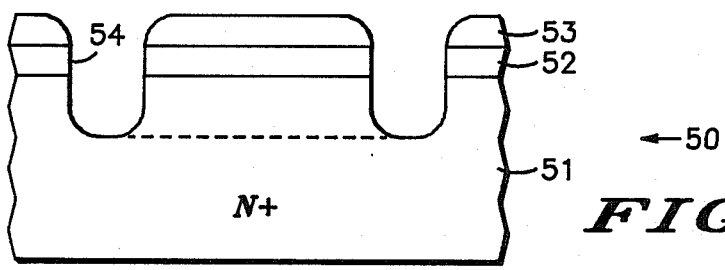
Figure 18B:
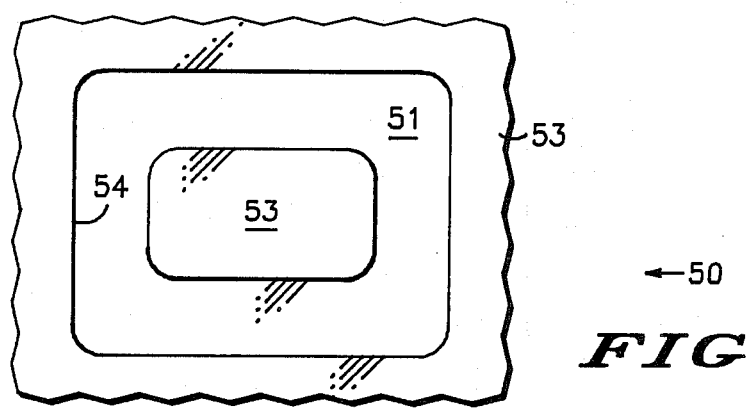

Referring now to the diagrams of FIGS. 17–21, a process for the manufacture of Zener diodes, generally designated 50, embodying the present invention is illustrated. FIG. 17 illustrates an N+ doped substrate 51 having an implanted P+ region 52 on the order of 0.4 microns in depth.

Next, a layer of photoresist 53 is deposited on the surface of region 52. Photoresist 53 is then masked to expose a moat area 54, FIG. 18A. Zener 50 is then etched in the exposed area to a depth of approximately 2.0 micron, FIG. 18B. It is required that the depth of the etch be slightly more than the depth of region 52.

Figure 19:
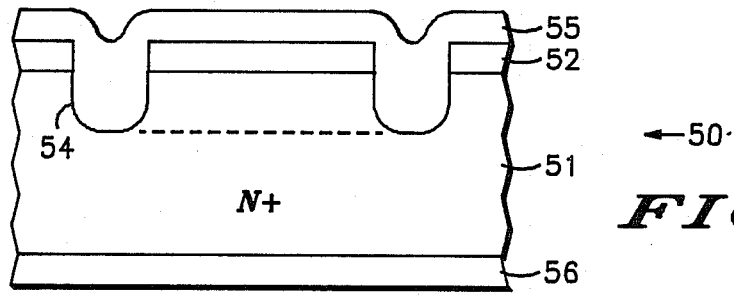
Figure 20:
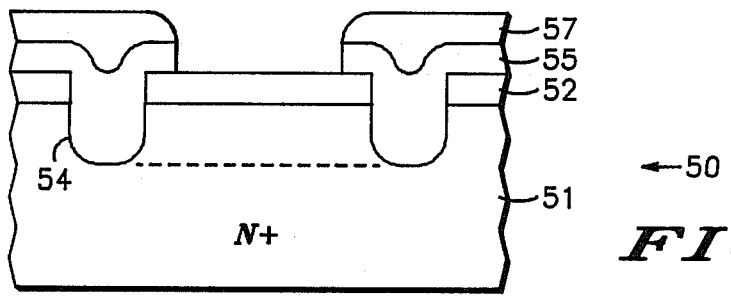
Figure 21:
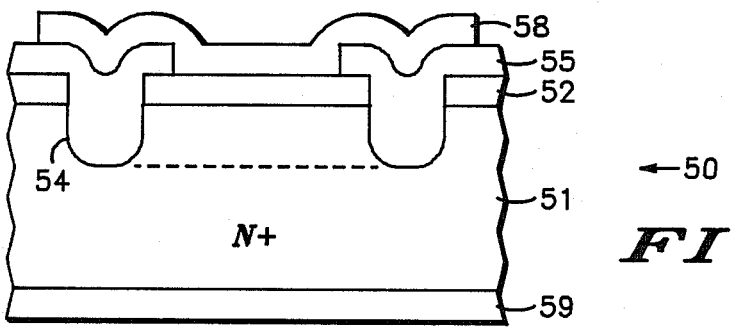

Zener 50 is then oxidized forming a top and a bottom oxide layers 55 and 56, respectively, FIG. 19. This oxidation is preferably performed at low temperature. This can be accomplished either by using a TEOS process, which operates around 700° C., or by a HIPOX (HIgh Pressure OXidation) process. Zener 50 is then annealed using either an RTA (Rapid Thermal Anneal) or a low temperature, below approximately 1000° C., anneal to activate the implanted dopant and set the breakdown voltage. A layer of photoresist 57 is then deposited on the surface of oxide 55. Resist 57 is then masked and etched to create a contact opening within layer 55 and to remove layer 56.

Zener 50 then undergoes some standard finishing. This may include lapping of the bottom surface of substrate 51. Top and bottom metals, 58 and 59, are then deposited on the top and bottom of Zener 50, respectively, FIG. 21.

Thus, after a review of the forgoing, it will be apparent to one skilled in the art that there has been provided in accordance with the invention, a device and method that fully satisfies the objects, aims and advantages set forth above.

It has been shown that the present invention provides a method of manufacturing a Zener diode that does not require a diffusion or getter processing; and that has fewer processing steps, providing a more economical device. It should be noted that one particular embodiment of the present invention has been illustrated and that the conductivity types of the semiconductor material may be reversed.

While the invention has been described in conjunction with specific embodiments thereof, it is evident that many alterations, modifications, and variations will be apparent to those skilled in the art in light of the foregoing description. Accordingly, it is intended to embrace all such alterations, modifications and variations in the appended claims.

I claim:

1. A method of manufacturing a Zener diode comprising the steps:
    ion implanting a dopant of a first conductivity type into a surface region of a substrate of a second conductivity type;
    delineating a moat in said substrate such that said moat extends through said surface region, said moat defining a mesa of said substrate;
    oxidizing a first face of said substrate forming an oxide layer thereon, said first face being adjacent said surface region;
    delineating an opening within said oxide layer exposing a portion of said mesa;
    depositing a layer of titanium on said exposed portion of said mesa;
    depositing a layer of nickel of said layer of titanium; and
    depositing a layer of silver on said layer of nickel.

2. The method of claim 1 wherein said step of delineating a moat comprises the steps of:
    depositing a layer of photoresist on said first face of said substrate;
    masking said photoresist to define said moat in said photoresist;
    developing said photoresist; and
    etching said substrate through said surface region.

3. The method of claim 1 wherein said step of oxidizing said first face comprises a low temperature oxidation.

4. The method of claim 3 wherein said low temperature oxidation comprises TEOS oxidation.

5. The method of claim 1 wherein said step of oxidizing said first face comprises a high pressure oxidation.

6. The method of claim 1 wherein said step of delineating an opening comprises the steps of:

depositing a second photoresist on said oxide layer;
masking said second photoresist to define said opening in said photoresist;
developing said photoresist; and
etching said oxide layer to expose said portion of said mesa.

7. The method of claim 1 further comprising, following the step of oxidizing said first face, the step of annealing said Zener diode.

8. The method of claim 7 wherein said step of annealing is performed by a rapid thermal anneal.

9. The method of claim 7 wherein said step of annealing is performed at a temperature below approximately 1000° C.

10. A method of manufacturing a Zener diode comprising the steps:
   ion implanting a dopant of a first conductivity type into a surface region of a substrate of a second conductivity type;
   depositing a layer of photoresist on a first face of said substrate, said first face being adjacent said surface region;
   masking said photoresist to define a moat in said photoresist;
   developing said photoresist;
   etching a moat in said substrate, said moat extending through said surface region and said moat defining a mesa of said substrate;
   oxidizing a first face of said substrate forming an oxide layer thereon;
   annealing said Zener diode;
   depositing a second photoresist on said oxide layer;
   masking said second photoresist to define an opening in said photoresist;
   developing said photoresist;
   etching said oxide layer to expose a porton of said mesa;
   depositing a layer of titanium on said exposed portion of said mesa;
   depositing a layer of nickel on said layer of titanium; and
   depositing a layer of silver on sai layer of nickel.

11. The method of claim 10 wherein said step of oxidizing said first face comprises a low temperature oxidation.

12. The method of claim 10 wherein said step of oxidizing said first face comprises a high pressure oxidation.

13. The method of claim 10 wherein said step of annealing is performed by a rapid thermal anneal.

* * * * *

UNITED STATES PATENT AND TRADEMARK OFFICE
CERTIFICATE OF CORRECTION

PATENT NO.  : 4,775,643
DATED       : October 4, 1988
INVENTOR(S) : Thomas A. Wetteroth It is certified that error appears in the above-identified patent and that said Letters Patent is hereby corrected as shown below:

Column 4, Claim 1, line 49, change "of" second occurrence, to -- on --.

Column 6, Claim 10, line 17, change "sai" to -- said --.

Signed and Sealed this

Fourteenth Day of March, 1989

Attest:

DONALD J. QUIGG

Attesting Officer

Commissioner of Patents and Trademarks